(12) United States Patent
Zhao

(10) Patent No.: US 11,937,419 B2
(45) Date of Patent: Mar. 19, 2024

(54) SEMICONDUCTOR DEVICE AND FORMING METHOD THEREOF

(71) Applicant: CHANGXIN MEMORY TECHNOLOGIES, INC., Hefei (CN)

(72) Inventor: Liang Zhao, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 201 days.

(21) Appl. No.: 17/391,181

(22) Filed: Aug. 2, 2021

(65) Prior Publication Data

US 2022/0059540 A1    Feb. 24, 2022

Related U.S. Application Data

(63) Continuation of application No. PCT/CN2021/097506, filed on May 31, 2021.

(30) Foreign Application Priority Data

Aug. 21, 2020   (CN) .......................... 202010849895.1

(51) Int. Cl.
| | | |
|---|---|---|
| H01L 21/00 | (2006.01) | |
| H01L 49/02 | (2006.01) | |
| H10B 12/00 | (2023.01) | |

(52) U.S. Cl.
CPC ............. *H10B 12/31* (2023.02); *H01L 28/91* (2013.01); *H10B 12/0335* (2023.02)

(58) Field of Classification Search
CPC ...... H10B 12/31; H10B 12/0335; H01L 28/51
See application file for complete search history.

(56) References Cited

U.S. PATENT DOCUMENTS 6,653,155 B2    11/2003    Won
6,844,610 B2    1/2005    Won
(Continued)

FOREIGN PATENT DOCUMENTS

CN    102074483 A    5/2011
CN    102655151 A    9/2012
(Continued)

OTHER PUBLICATIONS

Supplementary European Search Report in the European application No. 21773267.6, dated May 23, 2022, 7 pgs.
(Continued)

*Primary Examiner* — Richard A Booth
(74) *Attorney, Agent, or Firm* — Cooper Legal Group, LLC

(57) ABSTRACT

A semiconductor device and a forming method thereof are provided. The semiconductor device includes a substrate, a capacitor array and a supporting structure. A plurality of conductive contact plugs which are arranged at intervals are formed on the substrate. The capacitor array includes a plurality of columnar capacitors which are arranged at intervals. Each columnar capacitor is formed on a respective one of the conductive contact plugs. A lower electrode layer of the columnar capacitor is in contact connection with the conductive contact plug. The supporting structure is formed on the substrate at an edge of the capacitor array and surrounds the capacitor array. A spacing between an inner wall and an outer wall of the supporting structure on any cross section parallel to the substrate is greater than an aperture of a capacitor hole of any one of the columnar capacitors on the cross section.

15 Claims, 19 Drawing Sheets

(56) References Cited

U.S. PATENT DOCUMENTS

| | | |
|---|---|---|
| 7,387,939 B2 | 6/2008 | Manning |
| 7,585,741 B2 | 9/2009 | Manning |
| 7,915,136 B2 | 3/2011 | Manning |
| 8,043,923 B2 | 10/2011 | Kim |
| 8,164,132 B2 | 4/2012 | Manning |
| 8,946,800 B2 | 2/2015 | Kume |
| 10,840,248 B2 | 11/2020 | Nagai |
| 2002/0137273 A1 | 9/2002 | Won |
| 2003/0001187 A1* | 1/2003 | Basceri ............. H01L 28/55 257/E21.018 |
| 2004/0056755 A1 | 3/2004 | Won |
| 2006/0014344 A1 | 1/2006 | Manning |
| 2006/0249798 A1 | 11/2006 | Manning |
| 2009/0078981 A1 | 3/2009 | Yokoi |
| 2009/0286377 A1 | 11/2009 | Manning |
| 2011/0124173 A1 | 5/2011 | Kim |
| 2011/0165756 A1 | 7/2011 | Isogai |
| 2011/0186964 A1 | 8/2011 | Manning |
| 2012/0193760 A1 | 8/2012 | Manabe |
| 2013/0168812 A1 | 7/2013 | Lee |
| 2013/0285203 A1 | 10/2013 | Hiroi et al. |
| 2015/0056778 A1 | 2/2015 | Manabe et al. |
| 2017/0025416 A1 | 1/2017 | Han et al. |
| 2018/0122810 A1 | 5/2018 | Han et al. |
| 2019/0237469 A1 | 8/2019 | Nagai |

FOREIGN PATENT DOCUMENTS

| | | |
|---|---|---|
| CN | 110085574 A | 8/2019 |
| CN | 110970436 A | 4/2020 |
| CN | 111463205 A | 7/2020 |
| JP | 2000196038 A | 7/2000 |

OTHER PUBLICATIONS

International Search Report in the international application No. PCT/CN2021/079626, dated Jun. 8, 2021, 2 pgs.

International Search Report in the international application No. PCT/CN2021/097506, dated Sep. 1, 2021, 2 pgs.

* cited by examiner

SEMICONDUCTOR DEVICE AND FORMING METHOD THEREOF

CROSS-REFERENCE TO RELATED APPLICATION

The present application is a continuation application of International Application No. PCT/CN2021/097506, filed on May 31, 2021, which claims priority to Chinese patent application 202010849895.1, filed on Aug. 21, 2020 and entitled "SEMICONDUCTOR DEVICE AND FORMING METHOD THEREOF". The contents of International Application No. PCT/CN2021/097506 and Chinese patent application 202010849895.1 are hereby incorporated by reference in their entireties.

BACKGROUND

With the continuous development of a mobile device, the mobile device with a battery power supply, such as a mobile phone, a tablet computer, a wearable device or the like, is increasingly used in life. A memory is an indispensable element in the mobile device, and great demand on the small volume and the integration of the memory is put forward.

At present, a Dynamic Random Access Memory (DRAM) is widely used in the mobile device at its fast transmission speed. However, with the continuous miniaturization of the volume, the size of a columnar storage capacitor in the dynamic random access memory is also continuously reduced, the density is also increased, and the stability of a capacitor structure is also decreased.

It is to be noted that information disclosed in the above background section is only used to enhance an understanding of the background of the present disclosure, and therefore may include the information that does not constitute the related art known to those of ordinary skill in the art.

SUMMARY

The present disclosure relates to the technical field of a semiconductor and provides a semiconductor device and a forming method of the semiconductor device, which may laterally support the outside of a capacitor array, avoid the occurrence of a short circuit and improve the capacitance.

According to a first aspect of the present disclosure, there is provided a semiconductor device, including: a substrate, a capacitor array and a supporting structure.

A plurality of conductive contact plugs which are arranged at intervals are formed on the substrate.

The capacitor array includes a plurality of columnar capacitors which are arranged at intervals, each of the columnar capacitors is formed on a respective one of the conductive contact plugs, and a lower electrode layer of the columnar capacitor is in contact connection with the conductive contact plug.

The supporting structure is formed on the substrate at an edge of the capacitor array and surrounds the capacitor array, and a spacing between an inner wall and an outer wall of the supporting structure on any cross section parallel to the substrate is greater than an aperture of a capacitor hole of any one of the columnar capacitors on the cross section.

According to a second aspect of the present disclosure, a forming method of a semiconductor device is provided, and the method includes the following operations.

A substrate is provided.

A plurality of conductive contact plugs which are arranged at intervals are formed on the substrate.

A capacitor array is formed. The capacitor array includes a plurality of columnar capacitors which are arranged at intervals, each of the columnar capacitors is formed on a respective one of the conductive contact plugs, and a lower electrode layer of the columnar capacitor is in contact connection with the conductive contact plug.

A supporting structure is formed. The supporting structure is formed on the substrate at an edge of the capacitor array and surrounds the capacitor array, and a spacing between an inner wall and an outer wall of the supporting structure on any cross section parallel to the substrate is greater than an aperture of a capacitor hole of any one of the columnar capacitors on the cross section.

It is to be understood that both the foregoing general description and the following detailed description are exemplary and explanatory only and cannot form restriction to the present disclosure.

BRIEF DESCRIPTION OF THE DRAWINGS

The accompanying drawings, which are incorporated in and constitute a part of the specification, illustrate embodiments consistent with the present disclosure and, together with the specification, serve to explain the principles of the present disclosure. Apparently, for those skilled in the art, the drawings in the following description are only some embodiments of the present disclosure, and other drawings may also be obtained from these drawings without involving any inventive effort.

Figure 1:
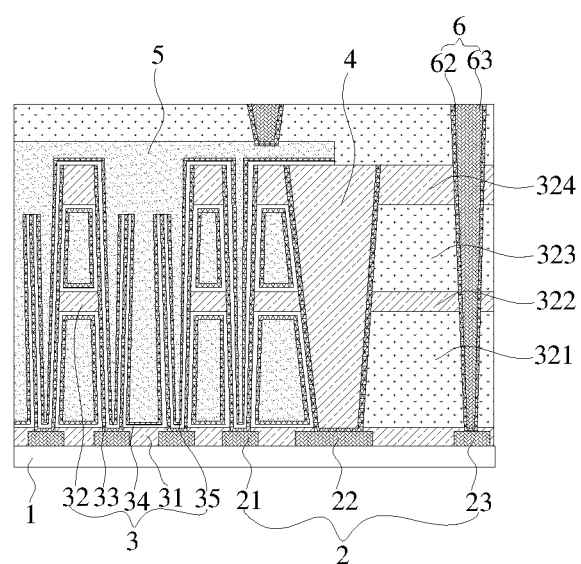
FIG. 1 is a structural schematic diagram of a semiconductor device in an embodiment of the present disclosure.

In the drawings: 1, substrate; 11, unit region; 12, peripheral region; 2, conductive contact plug; 21, first conductive contact plug; 22, second conductive contact plug; 23, peripheral conductive contact plug; 3, capacitor array; 31, insulating layer; 32, insulating dielectric layer; 321, first sacrificial layer; 322, first insulating dielectric layer; 323, second sacrificial layer; 324, second insulating dielectric layer; 3341, photoresist layer; 33, lower electrode layer; 34, capacitor dielectric layer; 35, upper electrode layer; 37, capacitor hole; 4, supporting structure; 41, annular ring; 5, semiconductor layer; 6, first interconnection structure; 61, first via hole; 62 connection layer; 63, lead-out layer; 7, covering layer and 71, opening.

DETAILED DESCRIPTION

Example embodiments will now be described more comprehensively with reference to the accompanying drawings. However, the example embodiments can be implemented in various forms and should not be construed as limited to the embodiments set forth here; rather, these embodiments are provided so that the present disclosure will be thorough and complete, and will fully convey the concept of the example embodiments to those skilled in the art. Same reference numerals in the drawings indicate the same or similar structures, and therefore their detailed description will be omitted. In addition, the drawings are merely schematic illustrations of the present disclosure and are not necessarily drawn to scale.

Although relative terms such as "upper" and "lower" are used in the specification to describe a relative relationship of one component of the reference sign to another component, these terms are used in the specification for convenience only, for example, according to an orientation of the example illustrated in the drawings. It will be appreciated that if an apparatus of the reference sign is turned upside down, the "upper" component described above will become the "lower" component. When a structure is "on" another structure, it may mean that the structure is integrally formed with the other structure, or that the structure is "directly" disposed on the other structure, or that the structure is "indirectly" disposed on the other structure through the other structure.

The terms "a", "an", "the", and "said" are used to indicate the presence of one or more elements/constituent parts/etc. The terms "including" and "having" are used in an open inclusive sense and mean that there may be additional elements/constituent parts/etc. in addition to the listed elements/constituent parts/etc. The terms "first" and "second" are used merely as labels and are not intended to limit the number of objects.

An embodiment of the present disclosure provides a semiconductor device. The semiconductor device may include a substrate 1, a capacitor array 3, and a supporting structure 4 as shown in FIG. 1.

A plurality of conductive contact plugs 2 which are arranged at intervals are formed on the substrate 1.

The capacitor array 3 includes a plurality of columnar capacitors which are arranged at intervals, each of the columnar capacitors is formed on a respective one of the conductive contact plugs 2, and a lower electrode layer 33 of the columnar capacitor is in contact connection with the conductive contact plug 2.

The supporting structure 4 is formed on the substrate 1 at an edge of the capacitor array 3 and surrounds the capacitor array 3, and a spacing between an inner wall and an outer wall of the supporting structure 4 on any cross section parallel to the substrate 1 is greater than an aperture of a capacitor hole of any one of the columnar capacitors on the cross section.

According to the semiconductor device of the present disclosure, since the supporting structure 4 surrounds the outside of the capacitor array 3 and may laterally support the outside of the capacitor array 3, the stability of the capacitor array 3 in a lateral direction is improved, a capacitor in the capacitor array 3 is prevented from laterally deforming, and the occurrence of a short circuit is avoided. Meanwhile, since a spacing between the inner wall and the outer wall of the supporting structure 4 on any cross section parallel to the substrate 1 is greater than an aperture of any capacitor hole in the capacitor array 3 on the cross section, the supporting strength of the supporting structure 4 may be ensured. In addition, since the capacitor array 3 includes a plurality of capacitors, when in use, the plurality of capacitors may be charged and discharged at the same time, and the capacitance may be improved.

Various parts of the semiconductor device according to the embodiment of the present disclosure are described in detail below.

As shown in FIG. 1, the substrate 1 may be a flat plate structure, which may be in a rectangular shape, a circular shape, an oval shape, a polygonal shape or an irregular shape. The material of the substrate may be silicon or other semiconductor material. A shape and the material of the substrate 1 are not specifically limited here.

The plurality of conductive contact plugs 2 may be formed on the substrate 1. For example, the conductive contact plug 2 may be formed on the substrate 1 in a manner of vacuum evaporation, magnetron sputtering, chemical vapor deposition, or the like. Of course, the conductive contact plug 2 may also be formed in other manners, which will not be enumerated here.

In an embodiment, the conductive contact plug 2 may include a first conductive contact plug 21 and a second conductive contact plug 22. The second conductive contact plug 22 may be an annular structure, which may be a circular ring or a rectangular ring. The second conductive contact plug 22 may be composed of conductor or semiconductor material, for example, the material may be tungsten, copper or polysilicon. There may be a plurality of first conductive contact plugs 21. The plurality of first conductive contact plugs 21 may be located within an annular shape of the second conductive contact plug 22 and may be distributed in an array, and the material of the first conductive contact plug 21 may be the same as that of the second conductive contact plug 22.

Figure 2:
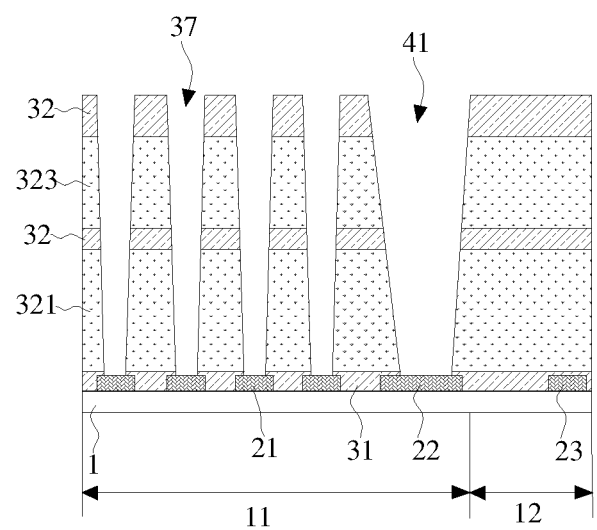
FIG. 2 is a structural schematic diagram of a capacitor hole and an annular ring in an embodiment of the present disclosure.

As shown in FIG. 2, the substrate 1 may include a unit region 11 and a peripheral region 12 which are arranged side by side. The capacitor array 3 may be formed on the substrate 1 and may be located on the unit region 11. The capacitor array 3 may include a plurality of columnar capacitors which are arranged at intervals, each of the columnar capacitors may be formed on a respective one of the conductive contact plugs 2, specifically, each of the columnar capacitors may be formed on each of the first conductive contact plugs 21. When in use, a plurality of capacitors may be charged and discharged at the same time, so that the capacitance is improved.

In one embodiment of the present disclosure, the capacitor array 3 may include an insulating layer 31, an insulating dielectric layer 32, a lower electrode layer 33, a capacitor dielectric layer 34, and an upper electrode layer 35. The insulating layer 31 is distributed between the first conductive contact plugs 21 and may be configured to separate first conductive contact plugs 21. The lower electrode layer 33 may be in a strip shape, which may be formed on a side of the first conductive contact plug 21 deviating from the substrate 1, may be in contact connection with the first conductive contact plug 21, and may extend along a direction perpendicular to the contact with the first conductive contact plug 21, towards the side of the first conductive contact plug 21 deviating from the substrate 1, so as to form the columnar capacitor. The capacitor dielectric layer 34 may form a double-sided capacitor between the lower electrode layer 33 and the upper electrode layer 35, in order to improve the capacitance. The insulating dielectric layer 32 may cover a periphery of the lower electrode layer 33 and may laterally support the lower electrode layer 33, so that the stability of the lower electrode layer 33 in a lateral direction is improved, and the lower electrode layer 33 is prevented from laterally deforming.

For example, the insulating layer 31 may be formed on the substrate 1, and the insulating layer 31 may be formed on the substrate 1 in the manner of the vacuum evaporation, the magnetron sputtering, the chemical vapor deposition or the like. Of course, the insulating layer 31 may also be formed in other manners, which will not be enumerated here. The insulating layer 31 may have the same shape as the substrate 1, the material of the insulating layer may be silicon nitride, silicon oxide or the like, and the material of the insulating layer is not specifically limited here.

The insulating layer 31 may be provided with an annular hole and a plurality of openings which are located in the annular hole and are distributed in an array. Both the annular hole and each opening may be through holes. The annular hole may be a circular ring or a rectangular ring. Each opening may be in a circular shape, a rectangular shape or an irregular shape. The shape of the annular hole and each opening is not specifically limited here.

The second conductive contact plug 22 may be formed in the annular hole, and meanwhile, the first conductive contact plug 21 may be formed in each opening. The second conductive contact plug 22 and the plurality of first conductive contact plugs 21 may be formed at the same time through a one-time process, for example, the second conductive contact plug 22 and the plurality of first conductive contact plugs 21 may be formed at the same time through a chemical vapor deposition process. In an embodiment, the second conductive contact plug 22 may be in contact with the substrate 1 through the annular hole, and meanwhile, each of the first conductive contact plugs 21 may be in contact with the substrate 1 through each opening.

The insulating dielectric layer 32 is at least formed on the substrate 1, for example, the insulating dielectric layer 32 may be formed on a side of the insulating layer 31 deviating from the substrate 1, and the insulating dielectric layer 32 may cover both the unit region 11 and the peripheral region 12 at the same time. Both the capacitor array 3 and the supporting structure 4 may be formed within the insulating dielectric layer 32 directly opposite the unit region 11, that is, the insulating dielectric layer 32 may be configured to support the capacitor.

As shown in FIG. 2, the insulating dielectric layer 32 may have a plurality of through holes exposing each of the first conductive contact plugs 21. The through hole may be a capacitor hole 37, which may be configured to form the capacitor. Each capacitor hole 37 may penetrate the insulating dielectric layer 32 in the direction perpendicular to the insulating dielectric layer 32. A shape of a cross section of the capacitor hole may be circular, rectangular or the like, or may also be irregular. The shape of the capacitor hole 37 is not specifically limited here. The through hole may further include an annular ring 41 and may be configured to form the supporting structure 4, which may be a circular ring or a rectangular ring, and is not specifically limited here.

For example, the insulating dielectric layer 32 may include a first insulating dielectric layer 322 and a second insulating dielectric layer 324 which are arranged at intervals along the direction perpendicular to the substrate 1. The first insulating dielectric layer 322 and the second insulating dielectric layer 324 may be formed in the manner of the vacuum evaporation, the magnetron sputtering, the chemical vapor deposition or the like. Of course, the insulating dielectric layer 32 may be formed by other processes, which are not specifically limited here.

The capacitor array 3 and the supporting structure 4 may be formed in the first insulating dielectric layer 322 and the second insulating dielectric layer 324. Each of the capacitors in the capacitor array 3 may be supported through the first insulating dielectric layer 322 and the second insulating dielectric layer 324, and meanwhile, an edge of the capacitor array 3 may be supported through the supporting structure 4.

Figure 3:
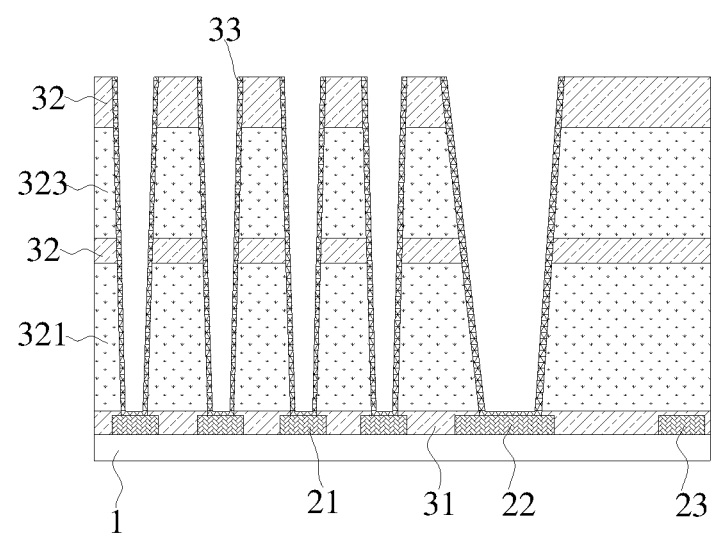
FIG. 3 is a structural schematic diagram of a lower electrode layer in an embodiment of the present disclosure.

As shown in FIG. 3, the lower electrode layer 33 adaptively attached to the bottom and a sidewall surface of the capacitor hole 37 may be formed in the capacitor hole 37, and the lower electrode layer 33 may be in contact connection with the first conductive contact plug 21 through the capacitor hole 37, so as to input the electric quantity stored in the lower electrode layer 33 to the first conductive contact plug 21, thereby realizing capacitance storage. For example, the lower electrode layer 33 may be formed in the capacitor hole 37 using a chemical vapor deposition process, and of course, the lower electrode layer 33 may be formed by other processes, which are not specifically limited. The material of the lower electrode layer 33 may be titanium nitride, and may have a thickness of 4 nm-10 nm, for example, 4 nm, 6 nm, 8 nm, or 10 nm. Of course, the lower electrode layer 33 may also be other material or other thicknesses, which will not be enumerated here.

As shown in FIG. 1, the capacitor dielectric layer 34 may be a thin film formed on an outer surface and an inner surface of a structure composed of the lower electrode layer 33 and the insulating dielectric layer 32 together. The capacitor dielectric layer 34 may be formed through a process such as the vacuum evaporation or the magnetron sputtering. Of course, the capacitor dielectric layer 34 may also be formed by other processes, which will not be enumerated here. The capacitor dielectric layer 34 may be a single-layer film structure made of the same material or a mixed film structure composed of film layers of different materials. For example, the capacitor dielectric layer 34 may include the material having a relatively high dielectric constant, for example, the capacitor dielectric layer may be made of materials such as aluminum oxide, hafnium oxide, lanthanum oxide, titanium oxide, zirconium oxide, tantalum oxide, niobium oxide, strontium oxide or mixtures thereof, and of course, the capacitor dielectric layer may also be made of other material, which will not be enumerated here.

The upper electrode layer 35 may be formed on the outer surface of the capacitor dielectric layer 34 using the chemical vapor deposition process, and of course, the upper electrode layer 35 may also be formed by other processes, which are specifically limited here. The material of the upper electrode layer 35 may be the titanium nitride, and may have a thickness of 2 nm-8 nm, for example, 2 nm, 4 nm, 6 nm, or 8 nm. Of course, the upper electrode layer 35 may also be made of other materials or may have other thicknesses, which will not be enumerated here.

Figure 4:
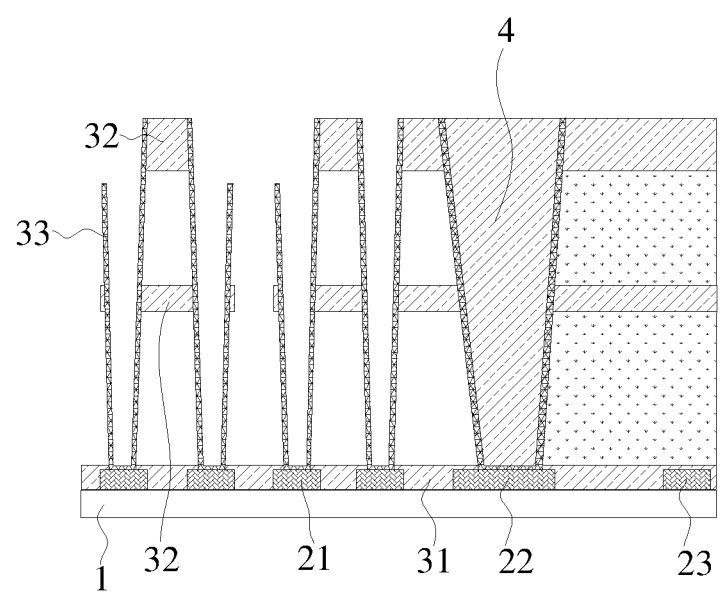
FIG. 4 is a structural schematic diagram of a supporting structure in an embodiment of the present disclosure.

The supporting structure 4 may be formed on the substrate 1, and the supporting structure 4 may be located at the edge of the capacitor array 3 and may surround the periphery of the capacitor array 3. For example, as shown in FIG. 4, the supporting structure 4 may be formed on a surface of the second conductive contact plug 22 deviating from the substrate 1, and a bottom of the supporting structure 4 may be in contact with the second conductive contact plug 22. The supporting structure 4 may be formed on the surface of the second conductive contact plug 22 deviating from the substrate 1 in the manner of the vacuum evaporation, the magnetron sputtering or the chemical vapor deposition. The material of the supporting structure 4 may be the same as the material of the insulating dielectric layer 32, for example, the material may be silicon nitride.

The supporting structure 4 may be in contact connection with the capacitor array 3, for example, the supporting structure 4 may be in contact connection with the insulating dielectric layer 32 in the capacitor array 3, so as to support a periphery of the capacitor located at an edge part of the capacitor array 3, improve the stability of the capacitor array 3 in the lateral direction, prevent the capacitor located at the edge part of the capacitor array 3 from laterally deforming, and avoid the occurrence of a short circuit.

A spacing between the inner wall and the outer wall of the supporting structure 4 on any cross section parallel to the substrate 1 is greater than an aperture of the capacitor hole 37 of any one of the columnar capacitors in the capacitor array 3 on the cross section, so that the supporting strength of the supporting structure 4 to the capacitor located at the edge part of the capacitor array 3 may be ensured. For example, a spacing between the inner wall and the outer wall of the supporting structure 4 on any cross section parallel to the substrate 1 may be at least twice aperture of any capacitor hole 37 in the capacitor array 3 on the cross section. Of course, the minimum value of a spacing between the inner wall and the outer wall of the supporting structure 4 may also be greater than the maximum value of aperture of any capacitor hole 37.

Meanwhile, to ensure the supporting strength to the top of the capacitor, a spacing between the inner wall and the outer wall of the supporting structure 4 may be sequentially increased from a side close to the substrate 1 towards the side far away from the substrate 1. Of course, on all cross sections parallel to the substrate 1, a spacing between the inner wall and the outer wall of the supporting structure 4 may also be equal, and the size between the inner wall and the outer wall of the supporting structure 4 is not specifically limited here.

In one embodiment, an orthographic projection of the supporting structure 4 on the second conductive contact plug 22 may coincide with a boundary of the second conductive contact plug 22, that is, the supporting structure 4 may be a continuous whole and the supporting structure 4 may continuously cover the outside of the capacitor array 3, in order to continuously support the edge part of the capacitor array 3. In another embodiment, the supporting structure 4 may be a non-continuous segment and may include a plurality of supporting regions which are distributed at intervals and supporting columns, and each of supporting columns is formed on a respective one of the supporting regions. Each of the supporting columns may be equal in thickness and may be arranged into a ring. Each of the supporting columns may be in contact connection with the insulating dielectric layer 32 of the capacitor array 3 in order to provide segmented support for the capacitor array 3.

The thickness of the supporting structure 4 in the direction perpendicular to the substrate 1 may be equal to the height of each of capacitors in the capacitor array 3 in the direction perpendicular to the substrate 1. The capacitor array 3 may be supported laterally, and the capacitor array 3 may also be supported longitudinally, so that the stability of the device is improved. For example, the thickness of the supporting structure 4 in the direction perpendicular to the substrate 1 may be equal to the height of the lower electrode layer 33 in the direction perpendicular to the substrate 1, and the lower electrode layer 33 of the capacitor located at the edge of the capacitor array 3 may be laterally and longitudinally supported by the supporting structure 4, in order to prevent outward deformation of the lower electrode layer 33 of the capacitor located at the edge of the capacitor array 3.

Figure 5:
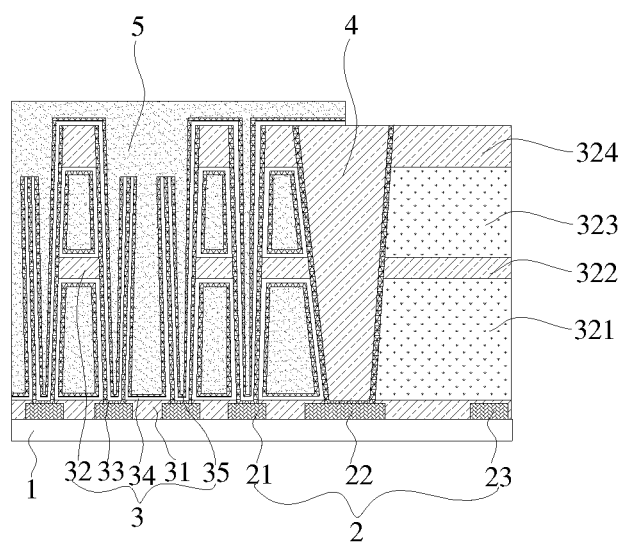
FIG. 5 is a structural schematic diagram of a semiconductor layer in an embodiment of the present disclosure.
Figure 6:
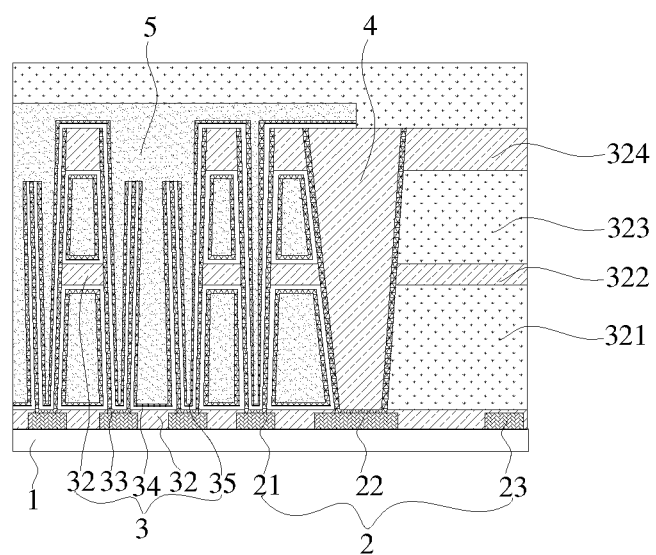
FIG. 6 is a structural schematic diagram of an insulating dielectric layer in an embodiment of the present disclosure.

In an embodiment, as shown in FIG. 1, FIG. 5 and FIG. 6, the semiconductor device of the present disclosure may further include a semiconductor layer 5. The semiconductor layer 5 may cover the surface of the capacitor array 3 and may fill up the capacitor holes 37 and gaps between two adjacent capacitors in the capacitor array 3.

The semiconductor layer 5 covering the capacitor array 3 may be formed on the surface of the upper electrode layer 35 through a vacuum evaporation process, so that an electric charge is in sufficient contact with a second electrode, which contributes to the improvement of the charging efficiency of the capacitor. As shown in FIG. 5, the semiconductor layer 5 may cover the surface of the capacitor array 3 and may fill up the capacitor holes 37 and the gaps between two adjacent capacitors in the capacitor array 3, thereby improving the conductivity of the device and enhancing the stability of each of the capacitors in the capacitor array 3. The semiconductor layer 5 may be made of silicon material, metal material or a metal compound. For example, the semiconductor layer 5 may be made of silicon, silicon germanium, tungsten, titanium silicide, titanium oxide, tungsten oxide or the like, which is not specifically limited here.

In an embodiment, the conductive contact plug 2 may further include a peripheral conductive contact plug 23. The peripheral conductive contact plug 23 may be formed in the peripheral region 12 of the substrate 1. The semiconductor device of the present disclosure may further include an interconnection structure. The interconnection structure may be formed in the insulating dielectric layer 32 corresponding to the peripheral region 12 and may be in contact connection with the peripheral conductive contact plug 23, in order to chemically lead out the capacitor array 3. The peripheral conductive contact plug 23 may have the same material and thickness as the first conductive contact plug 21 and the second conductive contact plug 22. The peripheral conductive contact plug 23 may be formed while the first conductive contact plug 21 and second conductive contact plug 22 are formed.

Figure 7:
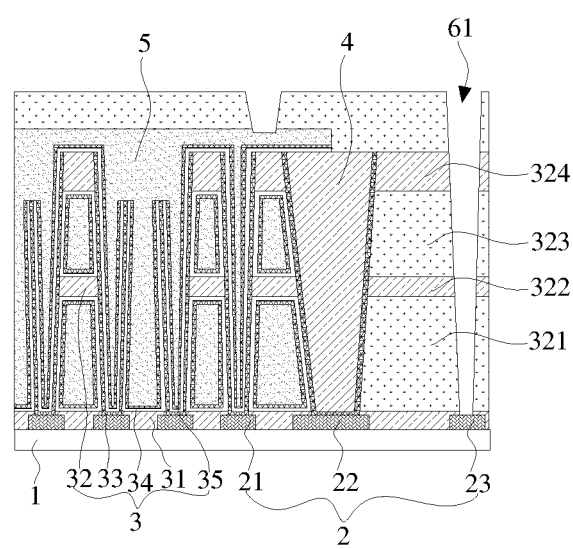
FIG. 7 is a structural schematic diagram of a first via hole in an embodiment of the present disclosure.
Figure 8:
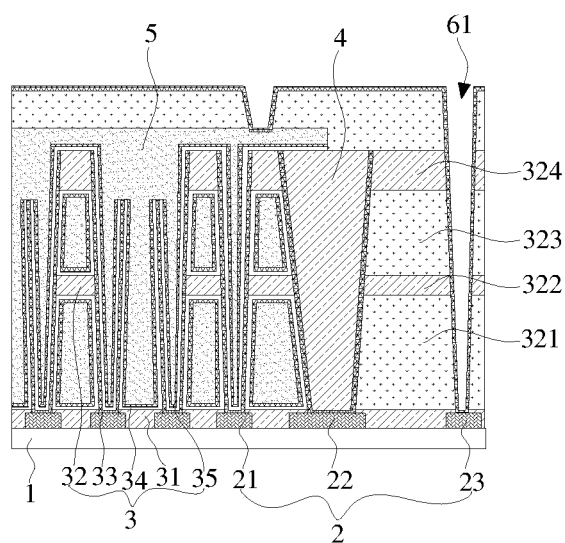
FIG. 8 is a structural schematic diagram of a connection layer in an embodiment of the present disclosure.

As shown in FIG. 7 and FIG. 8, a first interconnection structure 6 may be formed in a first via hole 61 through a chemical vapor deposition process. The first interconnection structure 6 may be communicated with the semiconductor layer 5 through the first via hole 61, in order to electrically lead out the capacitor array 3.

The first interconnection structure 6 may include a connection layer 62 and a lead-out layer 63. The connection layer 62 may be adaptively attached to a hole wall and a bottom surface of the first via hole 61 and may be communicated with the top of the semiconductor layer 5. The lead-out layer 63 may be located on the connection layer 62 and may fill up the first via hole 61. The material of both the connection layer 62 and the lead-out layer 63 may be conductive materials. For example, the material of the connection layer 62 may be titanium nitride, and the material of the lead-out layer 63 may be tungsten.

Figure 9:
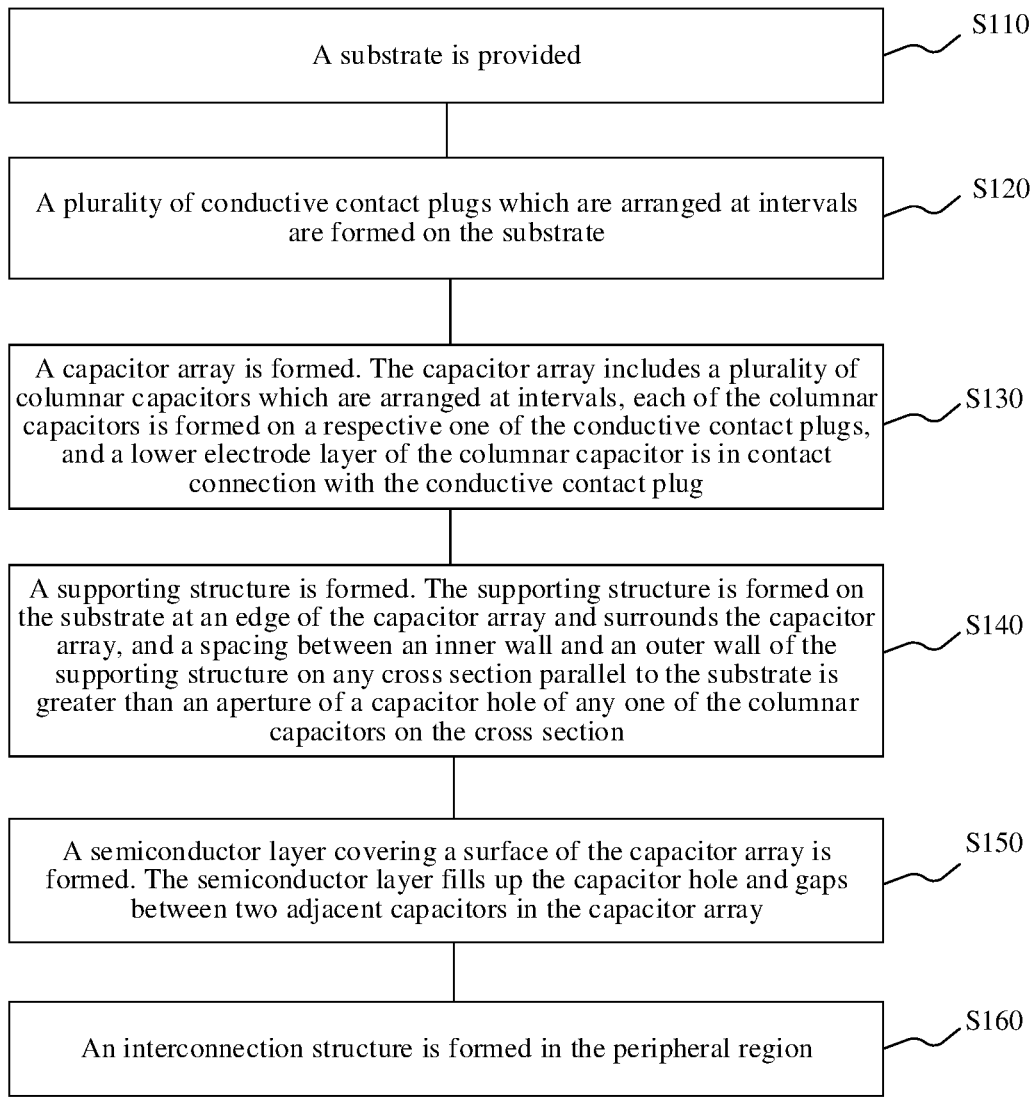
FIG. 9 is a flow chart of a forming method of a semiconductor device in an embodiment of the present disclosure.

An embodiment of the present disclosure further provides a forming method of a semiconductor device. As shown in FIG. 9, the method includes the following operations.

At S110, a substrate is provided.

At S120, a plurality of conductive contact plugs which are arranged at intervals are formed on the substrate.

At S130, a capacitor array is formed. The capacitor array includes a plurality of columnar capacitors which are arranged at intervals, each of the columnar capacitors is formed on a respective one of the conductive contact plugs, and a lower electrode layer of the columnar capacitor is in contact connection with the conductive contact plug.

At S140, the supporting structure is formed. The supporting structure is formed on the substrate at an edge of the capacitor array and surrounds the capacitor array, and a spacing between an inner wall and an outer wall of the supporting structure on any cross section parallel to the substrate is greater than an aperture of a capacitor hole of any one of the columnar capacitors on the cross section.

According to the forming method of a semiconductor device of the present disclosure, since the supporting structure 4 surrounds the outside of the capacitor array 3 and may laterally support the outside of the capacitor array 3, the stability of the capacitor array 3 in a lateral direction is improved, a capacitor in the capacitor array 3 is prevented from laterally deforming, and the occurrence of a short circuit is avoided. Meanwhile, since a spacing between the inner wall and the outer wall of the supporting structure 4 on any cross section parallel to the substrate 1 is greater than an aperture of any capacitor hole in the capacitor array 3 on the cross section, the supporting strength of the supporting structure may be ensured. In addition, since the capacitor array 3 includes a plurality of capacitors, when in use, the plurality of capacitors may be charged and discharged at the same time, and the capacitance may be improved.

Various operations of the forming method of a semiconductor device according to the embodiment of the present disclosure are described in detail below.

At S110, a substrate is provided.

The substrate 1 may be a flat plate structure, which may be in a rectangular shape, a circular shape, an oval shape, a polygonal shape or an irregular shape. The material of the substrate may be silicon or other semiconductor material. A shape and the material of the substrate 1 are not specifically limited here.

At S120, a plurality of conductive contact plugs which are arranged at intervals are formed on the substrate.

The plurality of conductive contact plugs 2 may be formed on the substrate 1. For example, the conductive contact plug 2 may be formed on the substrate 1 in a manner of vacuum evaporation, magnetron sputtering, chemical vapor deposition or the like. Of course, the conductive contact plug 2 may also be formed in other manners, which will not be enumerated here.

In an embodiment, the conductive contact plug 2 may include a first conductive contact plug 21 and a second conductive contact plug 22. The second conductive contact plug 22 may be an annular structure, which may be a circular ring or a rectangular ring. The second conductive contact plug 22 may be composed of conductor or semiconductor material, for example, the material may be tungsten, copper or polysilicon. There may be a plurality of first conductive contact plugs 21. The plurality of first conductive contact plugs 21 may be located within an annular shape of the second conductive contact plug 22 and may be distributed in an array, and the material of the first conductive contact plug 21 may be the same as that of the second conductive contact plug 22. The substrate 1 may include a unit region 11 and a peripheral region 12 which are arranged side by side. The first conductive contact plug 21 and the second conductive contact plug 22 are formed in the unit region 11.

At S130, a capacitor array is formed. The capacitor array includes a plurality of columnar capacitors which are arranged at intervals, each of the columnar capacitors is formed on a respective one of the conductive contact plugs, and a lower electrode layer of the columnar capacitor is in contact connection with the conductive contact plug.

The capacitor array 3 may be formed on the substrate 1 and may be located on the unit region 11. The capacitor array 3 may include a plurality of columnar capacitors which are arranged at intervals, each of the columnar capacitors may be formed on a respective one of the conductive contact plugs, specifically, each of the columnar capacitors may be formed on each of the first conductive contact plugs 21. When in use, a plurality of capacitors may be charged and discharged at the same time, so that the capacitance is improved.

In one embodiment of the present disclosure, the capacitor array 3 may include an insulating layer 31, an insulating dielectric layer 32, a lower electrode layer 33, a capacitor dielectric layer 34 and an upper electrode layer 35. The insulating layer 31 is distributed between the first conductive contact plugs 21 and may be configured to separate the first conductive contact plugs 21. The lower electrode layer 33 may be in a strip shape, which may be formed on a side of the first conductive contact plug 21 deviating from the substrate 1, may be in contact connection with the first conductive contact plug 21 and may extend along a direction perpendicular to the contact with the first conductive contact plug 21, towards the side of the first conductive contact plug 21 deviating from the substrate 1, so as to form the columnar capacitor. The capacitor dielectric layer 34 may form a double-sided capacitor between the lower electrode layer 33 and the upper electrode layer 35, in order to improve the capacitance. The insulating dielectric layer 32 may cover a periphery of the lower electrode layer 33 and may laterally support the lower electrode layer 33, so that the stability of the lower electrode layer 33 in a lateral direction is improved, and the lower electrode layer 33 is prevented from laterally deforming.

For example, the insulating layer 31 may be formed on the substrate 1, and the insulating layer 31 may be formed on the substrate 1 in the manner of the vacuum evaporation, the magnetron sputtering, the chemical vapor deposition or the like. Of course, the insulating layer 31 may also be formed in other manners, which will not be enumerated here. The insulating layer 31 may have the same shape as the substrate 1, the material of the insulating layer may be silicon nitride, silicon oxide or the like, and the material of the insulating layer is not specifically limited here.

The insulating layer 31 may be provided with an annular hole, and a plurality of openings which are located in the annular hole and are distributed in an array. Both the annular hole and each opening may be through holes. The annular hole may be a circular ring or a rectangular ring. Each opening may be in a circular shape, a rectangular shape or an irregular shape. The shape of the annular hole and each opening is not specifically limited here.

The second conductive contact plug 22 may be formed in the annular hole, and meanwhile, the first conductive contact plug 21 may be formed in each opening. The second conductive contact plug 22 and the plurality of first conductive contact plugs 21 may be formed at the same time through a one-time process, for example, the second conductive contact plug 22 and the plurality of first conductive contact plugs 21 may be formed at the same time through a chemical vapor deposition process. In an embodiment, the second conductive contact plug 22 may be in contact with the substrate 1 through the annular hole, and meanwhile, each of the first conductive contact plugs 21 may be in contact with the substrate 1 through each opening.

The insulating dielectric layer 32 is at least formed on the substrate 1, for example, the insulating dielectric layer 32 may be formed on a side of the insulating layer 31 deviating from the substrate 1, and the insulating dielectric layer 32 may cover both the unit region 11 and the peripheral region 12 at the same time. Both the capacitor array 3 and the supporting structure 4 may be formed within the insulating dielectric layer 32 directly opposite the unit region 11, that is, the insulating dielectric layer 32 may be configured to support the capacitor.

As shown in FIG. 2, the insulating dielectric layer 32 may have a plurality of through holes exposing each of the first conductive contact plugs 21. The through hole may be a capacitor hole 37, which may be configured to form the capacitor. Each capacitor hole 37 may penetrate the insulating dielectric layer 32 in the direction perpendicular to the insulating dielectric layer 32. A shape of a cross section of the capacitor hole may be circular, rectangular or the like, or may also be an irregular shape. The shape of the capacitor hole 37 is not specifically limited here. The through hole may further include an annular ring 41 and may be configured to form the supporting structure 4, which may be a circular ring or a rectangular ring, and is not specifically limited here.

For example, the insulating dielectric layer 32 may include a first insulating dielectric layer 322 and a second insulating dielectric layer 324 which are arranged at intervals along the direction perpendicular to the substrate 1. The first insulating dielectric layer 322 and the second insulating dielectric layer 324 may be formed in the manner of the vacuum evaporation, the magnetron sputtering, the chemical vapor deposition or the like. Of course, the insulating dielectric layer 32 may be formed by other processes, which are not specifically limited here.

The capacitor array 3 and the supporting structure 4 may be formed in the first insulating dielectric layer 322 and the second insulating dielectric layer 324. Each of the capacitors in the capacitor array 3 may be supported through the first insulating dielectric layer 322 and the second insulating dielectric layer 324, and meanwhile, an edge of the capacitor array 3 may be supported through the supporting structure 4.

As shown in FIG. 3, the lower electrode layer 33 adaptively attached to the bottom and a sidewall surface of the capacitor hole 37 may be formed in the capacitor hole 37, and the lower electrode layer 33 may be in contact connection with the first conductive contact plug 21 through the capacitor hole 37, so as to input the electric quantity stored in the lower electrode layer 33 to the first conductive contact plug 21, thereby realizing capacitance storage. For example, the lower electrode layer 33 may be formed in the capacitor hole 37 using a chemical vapor deposition process, and of course, the lower electrode layer 33 may be formed by other processes, which are not specifically limited here. The material of the lower electrode layer 33 may be titanium nitride, and may have a thickness of 4 nm-10 nm, for example, 4 nm, 6 nm, 8 nm, or 10 nm. Of course, the lower electrode layer 33 may also be other material or other thicknesses, which will not be enumerated here.

As shown in FIG. 1, the capacitor dielectric layer 34 may be a thin film formed on an outer surface and an inner surface of a structure composed of the lower electrode layer 33 and the insulating dielectric layer 32 together. The capacitor dielectric layer 34 may be formed through a process such as the vacuum evaporation or the magnetron sputtering. Of course, the capacitor dielectric layer 34 may also be formed by other processes, which will not be enumerated here. The capacitor dielectric layer 34 may be a single-layer film structure made of the same material or a mixed film structure composed of film layers of different materials. For example, the capacitor dielectric layer 34 may include the material having a relatively high dielectric constant, for example, the capacitor dielectric layer 34 may be made of materials such as aluminum oxide, hafnium oxide, lanthanum oxide, titanium oxide, zirconium oxide, tantalum oxide, niobium oxide, strontium oxide or mixtures thereof, and of course, the capacitor dielectric layer 34 may also be made of other material, which will not be enumerated here.

The upper electrode layer 35 may be formed on the outer surface of the capacitor dielectric layer 34 using the chemical vapor deposition process, and of course, the upper electrode layer 35 may also be formed by other processes, which are specifically limited here. The material of the upper electrode layer 35 may be the titanium nitride, and may have a thickness of 2 nm-8 nm, for example, 2 nm, 4 nm, 6 nm, or 8 nm. Of course, the upper electrode layer 35 may also be made of other materials or may have other thicknesses, which will not be enumerated here.

At S140, the supporting structure is formed. The supporting structure is formed on the substrate at an edge of the capacitor array and surrounds the capacitor array, and a spacing between an inner wall and an outer wall of the supporting structure on any cross section parallel to the substrate is greater than an aperture of a capacitor hole of any one of the columnar capacitors on the cross section.

The supporting structure 4 may be formed on the substrate 1, and the supporting structure 4 may be located at the edge of the capacitor array 3 and may surround the periphery of the capacitor array 3. For example, as shown in FIG. 4, the supporting structure 4 may be formed on a surface of the second conductive contact plug 22 deviating from the substrate 1, and a bottom of the supporting structure 4 may be in contact with the second conductive contact plug 22. The supporting structure 4 may be formed on the surface of the second conductive contact plug 22 deviating from the substrate 1 in the manner of the vacuum evaporation, the magnetron sputtering or the chemical vapor deposition. The material of the supporting structure 4 may be the same as the material of the insulating dielectric layer 32, for example, the material may be silicon nitride.

The supporting structure 4 may be in contact connection with the capacitor array 3, for example, the supporting structure 4 may be in contact connection with the insulating dielectric layer 32 in the capacitor array 3, so as to support a periphery of the capacitor located at an edge part of the capacitor array 3, improve the stability of the capacitor array 3 in the lateral direction, prevent the capacitor located at the edge part of the capacitor array 3 from laterally deforming, and avoid the occurrence of a short circuit.

A spacing between the inner wall and the outer wall of the supporting structure 4 on any cross section parallel to the substrate 1 is greater than an aperture of the capacitor hole 37 of any one of the columnar capacitors in the capacitor array 3 on the cross section, so that the supporting strength of the supporting structure 4 to the capacitor located at the edge part of the capacitor array 3 may be ensured. For example, a spacing between the inner wall and the outer wall of the supporting structure 4 on any cross section parallel to the substrate 1 may be at least twice aperture of any capacitor hole 37 in the capacitor array 3 on the cross section. Of course, the minimum value of a spacing between the inner wall and the outer wall of the supporting structure 4 may also be greater than the maximum value of aperture of any capacitor hole 37.

Meanwhile, to ensure the supporting strength to the top of the capacitor, a spacing between the inner wall and the outer wall of the supporting structure 4 may be sequentially increased from a side close to the substrate 1 towards the side far away from the substrate 1. Of course, on all cross sections parallel to the substrate 1, a spacing between the inner wall and the outer wall of the supporting structure 4 may also be equal, and the size between the inner wall and the outer wall of the supporting structure 4 is not specifically limited here.

In one embodiment, an orthographic projection of the supporting structure 4 on the second conductive contact plug 22 may coincide with a boundary of the second conductive contact plug 22, that is, the supporting structure 4 may be a continuous whole and the supporting structure 4 may continuously cover the outside of the capacitor array 3 in order to continuously support the edge part of the capacitor array 3. In another embodiment, the supporting structure 4 may be a non-continuous segment and may include a plurality of supporting regions which are distributed at intervals and supporting columns, and each of the supporting columns is formed on a respective one of the supporting regions. Each of the supporting columns may be equal in thickness and may be arranged into a ring. Each of the supporting columns may be respectively in contact connection with the insulating dielectric layer 32 of the capacitor array 3 in order to provide segmented support for the capacitor array 3.

The thickness of the supporting structure 4 in the direction perpendicular to the substrate 1 may be equal to the height of each of capacitors in the capacitor array 3 in the direction perpendicular to the substrate 1. The capacitor array 3 may be supported laterally, and the capacitor array 3 may also be supported longitudinally, so that the stability of the device is improved. For example, the thickness of the supporting structure 4 in the direction perpendicular to the substrate 1 may be equal to the height of the lower electrode layer 33 in the direction perpendicular to the substrate 1, and the lower electrode layer 33 of the capacitor located at the edge of the capacitor array 3 may be laterally and longitudinally supported by the supporting structure 4, in order to prevent outward deformation of the lower electrode layer 33 of the capacitor located at the edge of the capacitor array 3.

Figure 10:
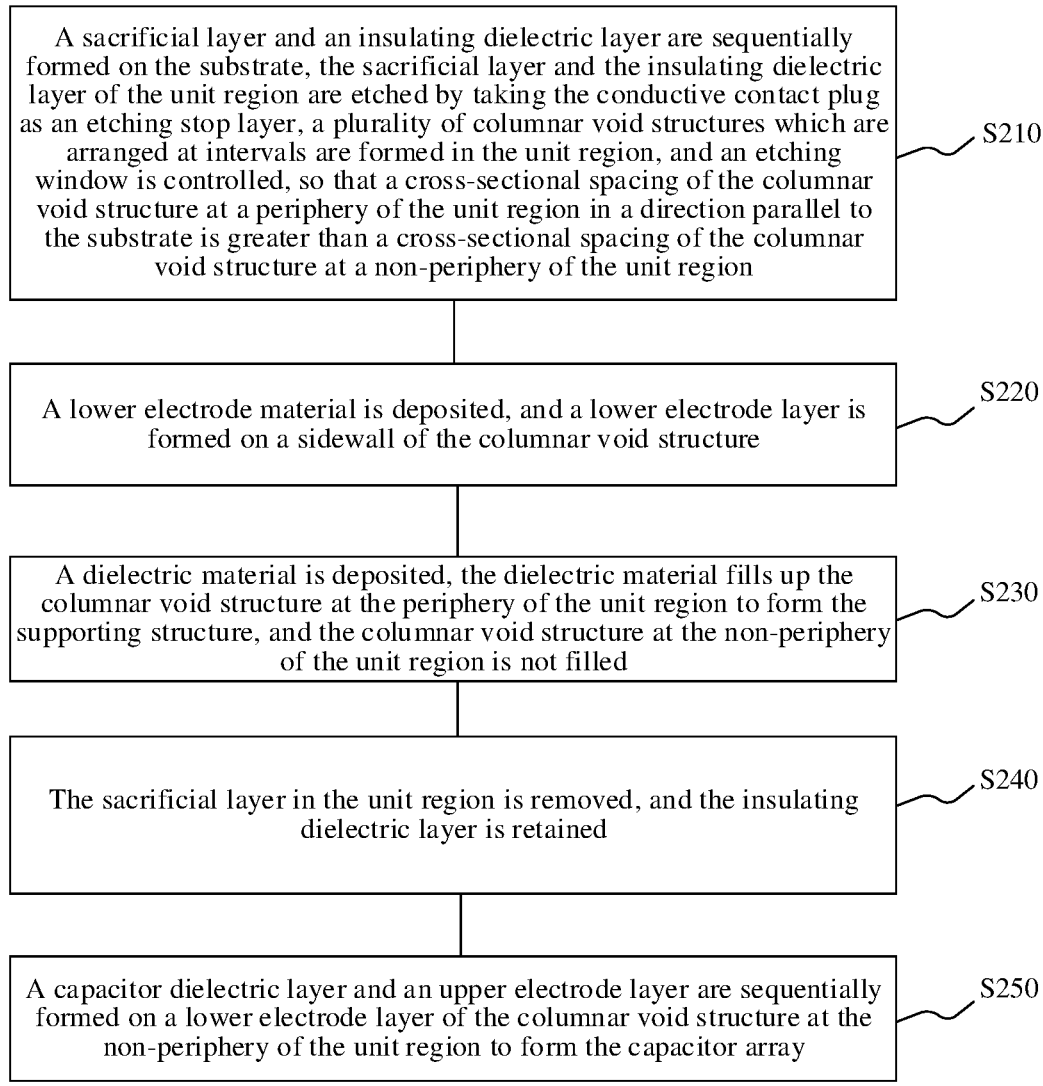
FIG. 10 is a flow chart of forming a capacitor array and a supporting structure in an embodiment of the present disclosure.

In one embodiment, the operations of forming a capacitor array 3 and a supporting structure 4 on substrate 1 may include S210-S250, as shown in FIG. 10.

At S210, a sacrificial layer and an insulating dielectric layer are sequentially formed on the substrate, the sacrificial layer and the insulating dielectric layer in the unit region are etched by taking the conductive contact plug as an etching stop layer, a plurality of columnar void structures which are arranged at intervals are formed in the unit region, and an etching window is controlled, so that a cross-sectional spacing of the columnar void structure at a periphery of the unit region along a direction parallel to the substrate is greater than a cross-sectional spacing of the columnar void structure at a non-periphery of the unit region.

The insulating layer 31 may be formed on the substrate 1 in the manner of the vacuum evaporation, the magnetron sputtering, the chemical vapor deposition or the like. Of course, the insulating layer 31 may also be formed in other manners, which will not be enumerated here. The insulating layer 31 may have the same shape as the substrate 1, the material of the insulating layer may be silicon nitride, silicon oxide or the like, and the material of the insulating layer is not specifically limited here.

A pattern in a mask may be transferred to the insulating layer 31 through a photo-etching process, the mask may be in a grid shape, and the pattern on the mask may be the same as the pattern required by the annular hole and the opening, so as to form an annular hole, and a plurality of openings which are located in the annular hole and are distributed in an array on the insulating layer 31. Both the annular hole and each opening may be through holes. The annular hole may be a circular ring or a rectangular ring. Each opening may be in a circular shape, a rectangular shape or an irregular shape. The shape of the annular hole and each opening is not specifically limited here.

Figure 11:
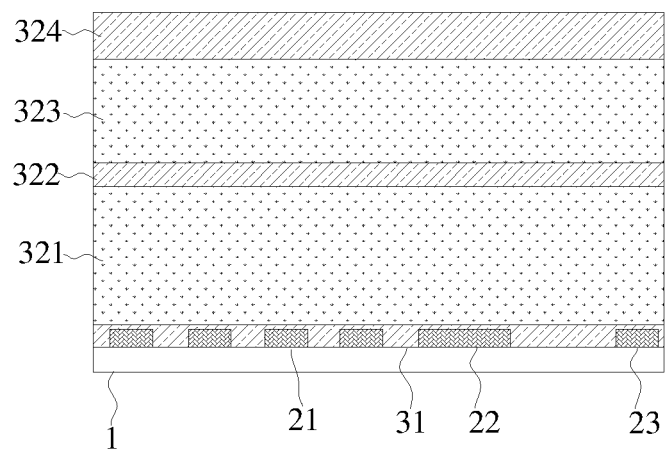
FIG. 11 is a structural schematic diagram of an insulating dielectric layer and a sacrificial layer in an embodiment of the present disclosure.

The sacrificial layer and the insulating dielectric layer 32 which are arranged in an overlapping manner may be sequentially formed on the surface of the structure composed of the first conductive contact plug 21, the second conductive contact plug 22 and the substrate 1 in the manner of the chemical vapor deposition or physical vapor deposition. As shown in FIG. 11, a first sacrificial layer 321, a first insulating dielectric layer 322, a second sacrificial layer 323 and a second insulating dielectric layer 324 which are sequentially laminated may be included. The first sacrificial layer 321, the first insulating dielectric layer 322, the second sacrificial layer 323 and the second insulating dielectric layer 324 may be formed in the manner of the vacuum evaporation or the magnetron sputtering, or the like. Of course, the first sacrificial layer 321, the first insulating dielectric layer 322, the second sacrificial layer 323 and the second insulating dielectric layer 324 which are laminated may be formed in other manners, which are not specifically limited here.

The first sacrificial layer 321 may be formed on the surface of the structure composed of the first conductive contact plug 21, the second conductive contact plug 22 and the substrate 1 together, and the material of the first sacrificial layer 321 may be SiO2. The first insulating dielectric layer 322 may be a thin film formed on the side of the first sacrificial layer 321 deviating from the substrate 1, and the material of the first insulating dielectric layer 322 may be silicon nitride or SiCN. The second sacrificial layer 323 may be formed on the side of the first insulating dielectric layer 322 deviating from the first sacrificial layer 321, and may have the same material and thickness as the first sacrificial layer 321. The top surface of the first sacrificial layer 321 and the second sacrificial layer 323 may be polished through a chemical polishing process, so that the thickness of each part of the first sacrificial layer 321 and the second sacrificial layer 323 is uniform. The second insulating dielectric layer 324 may be formed on the side of the second sacrificial layer 323 deviating from the first insulating dielectric layer 322, and may have the same material as the first insulating dielectric layer 322. It is to be noted that the thickness of each insulating dielectric layer 32 may be the same or different, which is not specifically limited here.

Figure 12:
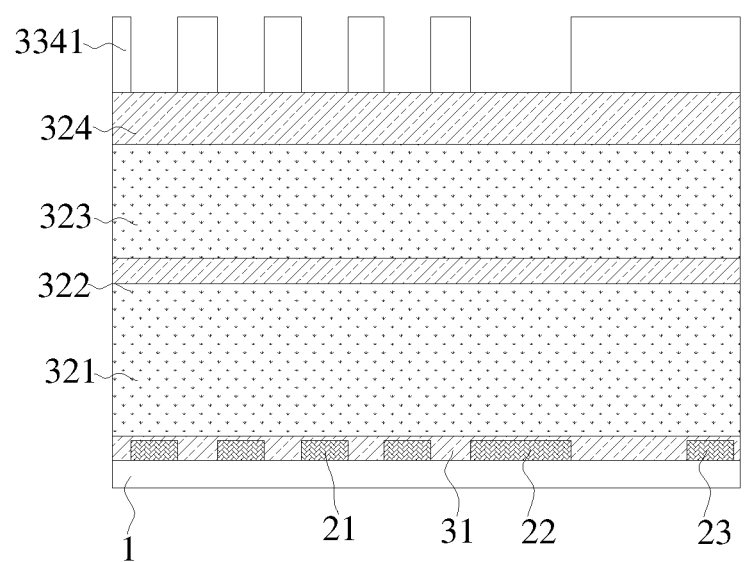
FIG. 12 is a structural schematic diagram of a structure after photoresist is formed on the insulating dielectric layer in an embodiment of the present disclosure.

A photoresist layer 3341 may be formed on the second insulating dielectric layer 324 through spin coating or in other manners. The material of the photoresist layer 3341 may be positive photoresist or negative photoresist, which is not specifically limited here. A shape of the surface of the photoresist layer 3341 far away from the second insulating dielectric layer 324 may be the same as that of the surface of the second insulating dielectric layer 324. The photoresist layer 3341 may be exposed using a mask. The pattern of the mask may match with the pattern required by the annular ring 41 and each capacitor hole 37. Subsequently, the exposed photoresist layer 3341 may be developed to form a development region, as shown in FIG. 12. The development region may expose the second insulating dielectric layer 324. The pattern of the development region may be the same as the pattern required by the annular ring 41 and each capacitor hole 37. The size of the development region may be the same as the size required by the annular ring 41 and each capacitor hole 37.

The first sacrificial layer 321, the first insulating dielectric layer 322, the second sacrificial layer 323 and the second insulating dielectric layer 324 may be etched in the development region through dry etching. By taking the conductive contact plug 2 as the etching stop layer, the plurality of columnar void structures which are arranged at intervals are formed in the unit region 11. The columnar void structure may expose the second conductive contact plug 22 and each of the first conductive contact plugs 21, and meanwhile, the size of the opening of the columnar void structure may be controlled, so that the cross-sectional spacing of the columnar void structure at the periphery of the unit region 11 in the direction parallel to the substrate 1 is greater than that of the columnar void structure at the non-periphery of the unit region 11. To facilitate distinguishment, the columnar void structure corresponding to the first conductive contact plug 21 may be used as the capacitor hole 37, and the columnar void structure corresponding to the second conductive contact plug 22 may be used as the annular ring 41.

To improve the capacity reserve, the size of each capacitor hole 37 may be sequentially increased from the side close to the substrate 1 towards the side far away from the substrate 1. Of course, each capacitor hole 37 may also be a straight hole. The size of each capacitor hole 37 is not specifically limited here. Meanwhile, to ensure the supporting strength to the top of the capacitor, a spacing between the inner wall and the outer wall of the annular ring 41 may be sequentially increased from the side close to the substrate 1 towards the side far away from the substrate 1. Of course, on all cross sections parallel to the substrate 1, a spacing between the inner wall and the outer wall of the annular ring 41 may also be equal, and the size between the inner wall and the outer wall of the annular ring 41 is not specifically limited here.

At S220, a lower electrode material is deposited, and a lower electrode layer is formed on a sidewall of the columnar void structure.

Figure 13:
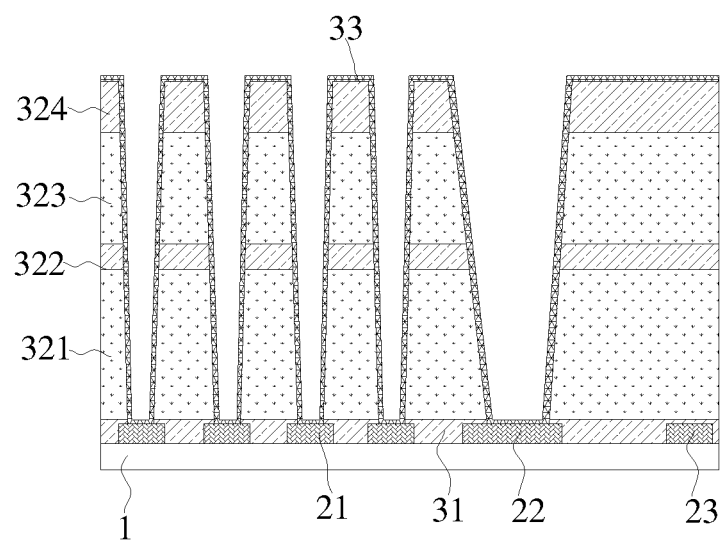
FIG. 13 is a structural schematic diagram of a lower electrode layer covering a capacitor hole and a top surface of the capacitor hole in an embodiment of the present disclosure.

The lower electrode layer 33 may be formed on the sidewall of the columnar void structure, specifically, the lower electrode layer 33 adaptively attached to the bottom and the sidewall surface of the capacitor hole 37 may be formed in the capacitor hole 37, as shown in FIG. 13. For the convenience of a process, the lower electrode layer 33 may be formed in the capacitor hole 37 and a top surface of the capacitor hole 37 at the same time, and then the lower electrode layer 33 on the top surface of the capacitor hole 37 may be removed. Only the lower electrode layer 33 on the bottom and the sidewall of the capacitor hole 37 are retained, and the finally formed lower electrode layer 33 is shown in FIG. 3. The lower electrode layer 33 may be in contact connection with the first conductive contact plug 21 through the capacitor hole 37, so as to input the electric quantity stored in the lower electrode layer 33 to a storage dielectric contact plug, thereby realizing capacitance storage.

For example, the lower electrode layer 33 may be formed in the capacitor hole 37 using a chemical vapor deposition process, and of course, the lower electrode layer 33 may be formed by other processes, which are not specifically limited here. The material of the lower electrode layer 33 may be titanium nitride, and may have a thickness of 4 nm-10 nm, for example, 4 nm, 6 nm, 8 nm, or 10 nm. Of course, the lower electrode layer 33 may also be other material or other thicknesses, which will not be enumerated here. In addition, for the convenience of the process, the lower electrode layer 33 may also be formed in the annular ring 41 at the same time.

At S230, a dielectric material is deposited, the dielectric material fills up the columnar void structure at the periphery of the unit region to form the supporting structure, and the columnar void structure at the non-periphery of the unit region is not filled.

Figure 14:
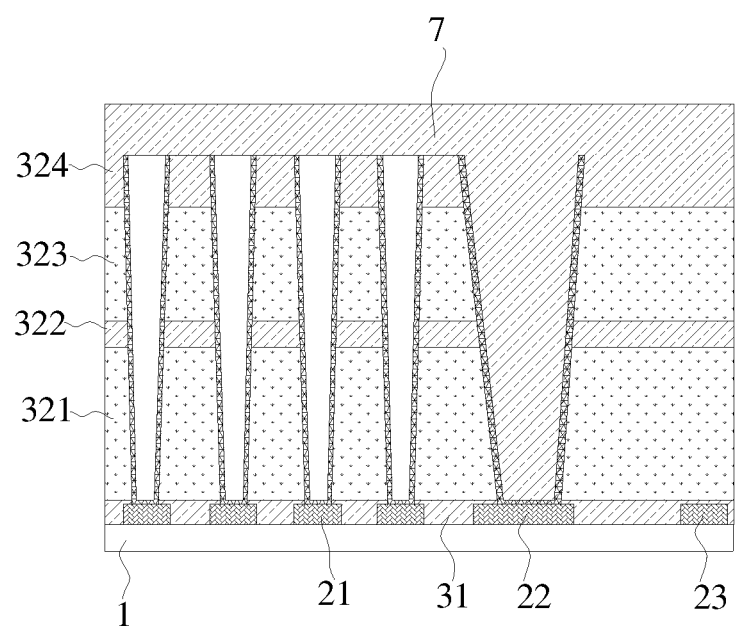
FIG. 14 is a structural schematic diagram of a covering layer in an embodiment of the present disclosure.

The dielectric material may be deposited on the surface of the second insulating dielectric layer 324 deviating from the second sacrificial layer 323 and in the annular ring 41 using the chemical vapor deposition process to form a covering layer 7, as shown in FIG. 14. The covering layer 7 is capable of filling up the columnar void structure at the periphery of the unit region 11, that is, filling up the annular ring 41 to form the supporting structure 4. At this time, the columnar void structure at the non-periphery of the unit region 11 is not filled, that is, the capacitor hole 37 is not filled. Meanwhile, a mask material layer may be formed on the side of the insulating dielectric layer 32 deviating from the substrate 1 through the chemical vapor deposition or in other manners, and the insulating dielectric layer 32 is farthest from the substrate 1. The mask material layer may cover the side of the capacitor hole 37 far away from the first conductive contact plug 21. The material of the mask material layer may be at least one of silicon oxide, nitrogen oxide or carbon, of course, may also be other material, and will not be enumerated here. The mask material layer may be a single-layer structure or a multi-layer structure, which is not specifically limited here.

Figure 15:
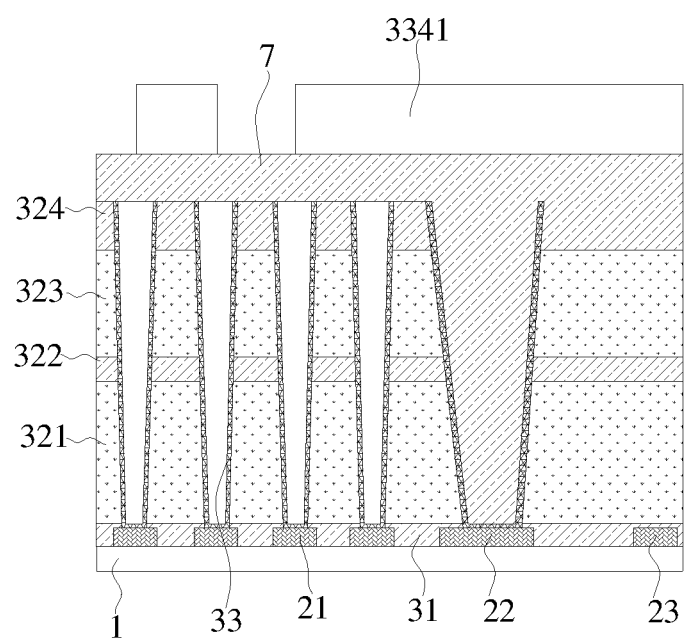
FIG. 15 is a structural schematic diagram of a structure after photoresist is formed on a covering layer in an embodiment of the present disclosure.
Figure 16:
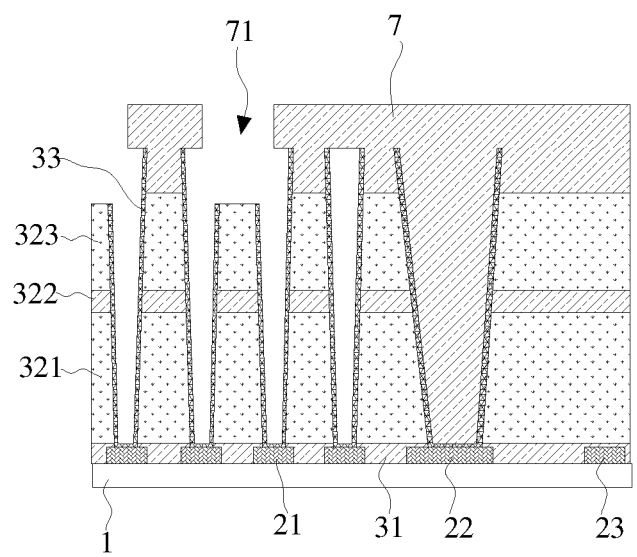
FIG. 16 is a structural schematic diagram of an opening formed on a covering layer in an embodiment of the present disclosure.
Figure 17:
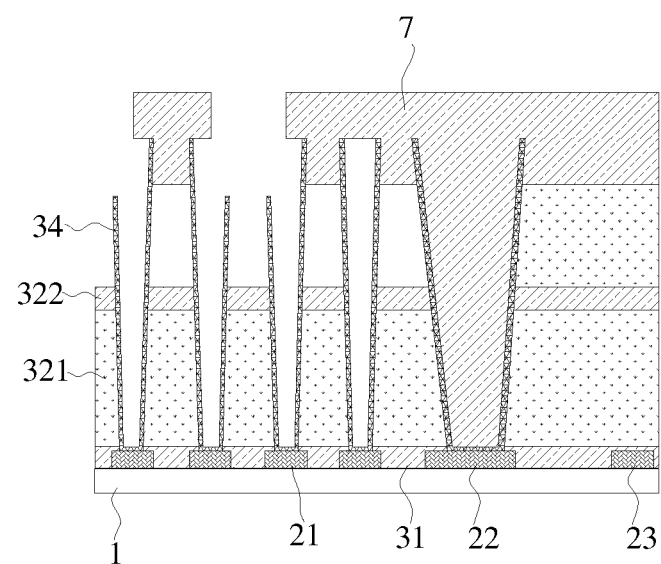
FIG. 17 is a structural schematic diagram of a structure after a sacrificial layer on the top is removed in an embodiment of the present disclosure.

The photoresist layer 3341 may be formed on the mask material layer through the spin coating or in other manners. The material of the photoresist layer 3341 may be the positive photoresist or the negative photoresist, which is not specifically limited here. As shown in FIG. 15, the photoresist layer 3341 may be exposed using a mask. The pattern of the mask may match with the pattern required by the opening on the insulating dielectric layer 32 furthest from substrate 1. As shown in FIG. 16, an orthographic projection of the opening 71 on the substrate 1 may cover a region between adjacent capacitor holes 37. Subsequently, the exposed photoresist layer 3341 may be developed to form the development region. The development region may expose the mask material layer. As shown in FIG. 17, the mask material layer and the insulating dielectric layer 32 farthest from the substrate 1 are etched in the developing region to form the opening 71. The sacrificial layer adjacent to the insulating dielectric layer 32 may be exposed through the opening 71.

At S240, the sacrificial layer in the unit region is removed, and the insulating dielectric layer is retained.

After the lower electrode layer 33 is formed, each sacrificial layer in the unit region 11 may be removed, and each insulating dielectric layer 32 is retained, so that the capacitance storage density may be increased, the lower electrode layer 33 may also be supported, the lower electrode layer 33 is prevented from deforming, and a short circuit risk is reduced.

Figure 18:
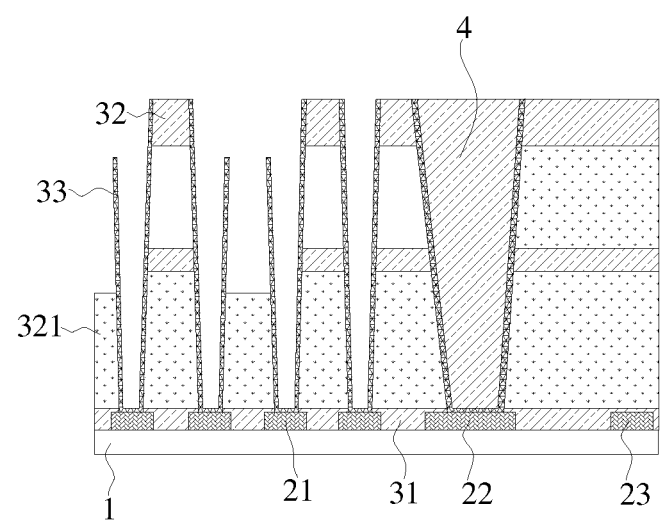
FIG. 18 is a structural schematic diagram of a covering layer after planarization process is carried out in an embodiment of the present disclosure.

In addition, as shown in FIG. 18, the surface of the covering layer 7 may also be flattened to remove the covering layer 7 on the top of the outside of the annular ring 41, so that the surface of the covering layer 7 in the annular ring 41 is flush with the surface of the side of the second insulating dielectric layer 324 deviating from the substrate 1, thereby forming the supporting structure 4.

At S250, a capacitor dielectric layer and an upper electrode layer are sequentially formed on a lower electrode layer of the columnar void structure at the non-periphery of the unit region to form the capacitor array.

The capacitor dielectric layer 34 may be formed on the lower electrode layer 33 in the capacitor hole 37 of the unit region 11, for example, the capacitor dielectric layer 34 may be the thin film formed on the surface of the lower electrode layer 33. The capacitor dielectric layer 34 may be formed through the process such as the vacuum evaporation or the magnetron sputtering. Of course, the capacitor dielectric layer 34 may also be formed by other processes, which will not be enumerated here. The capacitor dielectric layer 34 may be a single-layer film structure made of the same material or a mixed film structure composed of film layers of different materials. For example, the capacitor dielectric layer 34 may include the material having a relatively high dielectric constant, for example, the material of the capacitor dielectric layer may be aluminum oxide, hafnium oxide, lanthanum oxide, titanium oxide, zirconium oxide, tantalum oxide, niobium oxide, strontium oxide or mixtures thereof, and of course, the capacitor dielectric layer may also be made of other materials, which will not be enumerated here.

The upper electrode layer 35 may be formed on the outer surface of the capacitor dielectric layer 34 using the chemical vapor deposition process, and of course, the upper electrode layer 35 may also be formed by other processes, which are specifically limited here. The material of the upper electrode layer 35 may be the titanium nitride, and may have a thickness of 2 nm-8 nm, for example, 2 nm, 4 nm, 6 nm, or 8 nm. Of course, the upper electrode layer 35 may also be made of other materials or may have other thicknesses, which will not be enumerated here.

In an embodiment, the forming method of the present disclosure further includes operations as shown in FIG. 9.

At S150, a semiconductor layer covering the surface of the capacitor array is formed. The semiconductor layer fills up the capacitor holes and gaps between two adjacent capacitors in the capacitor array.

The semiconductor layer 5 covering the capacitor array 3 may be formed on the surface of the upper electrode layer 35 through a vacuum evaporation process, so that an electric charge is in sufficient contact with a second electrode, which contributes to the improvement of the charging efficiency of the capacitor. The semiconductor layer 5 may cover the surface of the capacitor array 3 and may fill up the capacitor holes 37 and the gaps between two adjacent capacitors in the capacitor array 3, thereby improving the conductivity of the device and enhancing the stability of each capacitor in the capacitor array 3. The semiconductor layer 5 may be made of silicon material, metal material or a metal compound. For example, the semiconductor layer 5 may be made of silicon, silicon germanium, tungsten, titanium silicide, titanium oxide, tungsten oxide or the like, which is not particularly limited here.

In one embodiment, the forming method of the present disclosure may further include the following operations. Before etching the sacrificial layer and the insulating dielectric layer 32 in the unit region 11, at S160, an interconnection structure is formed in the peripheral region.

The interconnection structure may be formed in the insulating dielectric layer 32 corresponding to the peripheral region 12 and may be in contact connection with the peripheral conductive contact plug 23, in order to chemically lead out the capacitor array 3. The peripheral conductive contact plug 23 may have the same material and thickness as the first conductive contact plug 21 and the second conductive contact plug 22. The peripheral conductive contact plug 23 may be formed while the first conductive contact plug 21 and second conductive contact plug 22 are formed.

Figure 19:
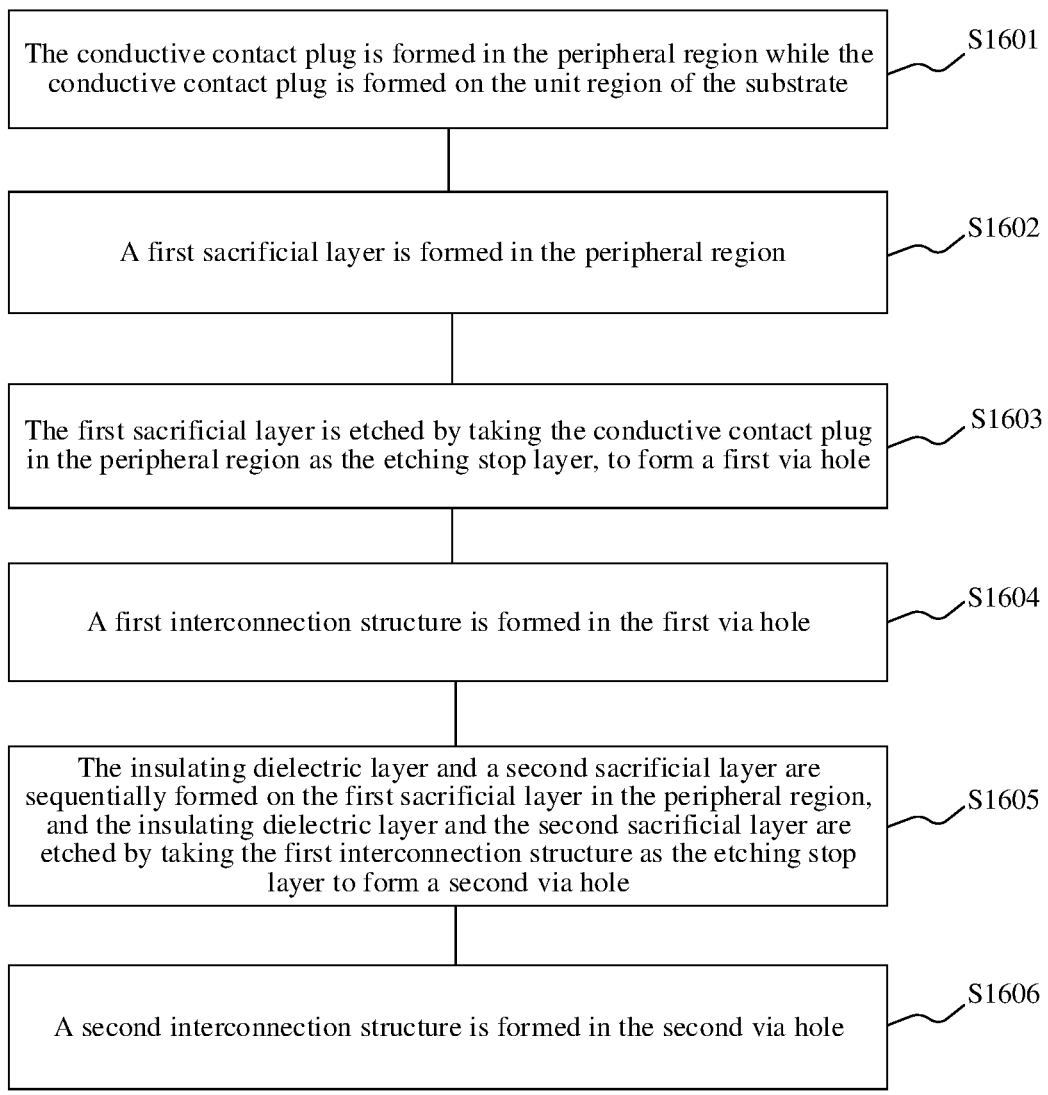
FIG. 19 is a flow chart corresponding to S160 in FIG. 9.

In one embodiment, as shown in FIG. 19, the operation that an interconnection structure is formed may include the following operations.

At S1601, the conductive contact plug is formed in the peripheral region while the conductive contact plug is formed on the unit region of the substrate.

The first conductive contact plug 21 and the second conductive contact plug 22 of the unit region 11, and the peripheral conductive contact plug 23 located in the peripheral region 12 may be formed at the same time through a one-time process. For example, the first conductive contact plug 21, the second conductive contact plug 22 and the peripheral conductive contact plug 23 may be formed at the same time through the chemical vapor deposition process and a dry etching process. Of course, the first conductive contact plug 21, the second conductive contact plug 22 and the peripheral conductive contact plug 23 may also be formed at the same time in other manners, which will not be enumerated again.

At S1602, a first sacrificial layer is formed in the peripheral region.

The first sacrificial layer 321 may be formed in the manner of the vacuum evaporation, the magnetron sputtering, the atomic layer deposition or the like.

At S1603, the first sacrificial layer is etched by taking the conductive contact plug in the peripheral region as the etching stop layer, to form a first via hole.

The first via hole 61 may be formed through a photo-etching process. The first via hole 61 may be formed in the first sacrificial layer 321 and may expose the peripheral conductive contact plug 23.

At S1604, a first interconnection structure is formed in the first via hole.

The first interconnection structure 6 may be formed in the first via hole 61 through a chemical vapor deposition process. The first interconnection structure 6 may be communicated with the semiconductor layer 5 through the first via hole 61, in order to electrically lead out the capacitor array 3.

The first interconnection structure 6 may include a connection layer 62 and a lead-out layer 63. The connection layer 62 may be adaptively attached to a hole wall and a bottom surface of the first via hole 61 and may be communicated with the top of the semiconductor layer 5. The lead-out layer 63 may be located on the connection layer 62 and may fill up the first via hole 61. The material of both the connection layer 62 and the lead-out layer 63 may be conductive material, for example. The material of the connection layer 62 may be titanium nitride, and the material of the lead-out layer 63 may be tungsten.

As shown in FIG. 19, the forming method of the present disclosure further includes the following operation. After forming the first interconnection structure, at S1605, the insulating dielectric layer and a second sacrificial layer are sequentially formed on the first sacrificial layer in the peripheral region, and the insulating dielectric layer and the second sacrificial layer are etched by taking the first interconnection structure as the etching stop layer, to form a second via hole.

The insulating dielectric layer 32 and the second sacrificial layer 323 may be sequentially formed on the first sacrificial layer 321 of the peripheral region 12 in the manner of the vacuum evaporation, the magnetron sputtering, atomic layer deposition or the like. The second via hole may be formed through the photo-etching process. The second via hole may be formed in the second sacrificial layer 323 and may be in contact connection with the first interconnection structure 6.

At S1606, a second interconnection structure is formed in the second via hole.

The second interconnection structure may be formed in the second via hole through the chemical vapor deposition process. The second interconnection structure may be communicated with the first interconnection structure 6 through the second via hole to electrically lead out the capacitor array 3.

The second interconnection structure may have the same structure and material as the first interconnection structure 6. The second interconnection structure may also include the connection layer and the lead-out layer. The connection layer may be adaptively attached to the hole wall and the bottom surface of the second via hole 91 and may be communicated with the top of the first interconnection structure 6. The lead-out layer may be located on the connection layer and may fill up the second via hole 91.

The semiconductor device of the present disclosure may be a memory chip, which may be, for example, a Dynamic Random Access Memory (DRAM), and of course, may be other semiconductor devices, which will not be enumerated here.

Other embodiments of the present disclosure will be apparent to those skilled in the art from consideration of the specification and practice of the present disclosure disclosed here. The present application is intended to cover any variations, uses, or adaptations of the present disclosure, and the variations, uses, or adaptations follow the general principles of the present disclosure and include common general knowledge or related technical means in the art undisclosed by the present disclosure. The specification and embodiments are considered as exemplary only, and a true scope and spirit of the present disclosure are indicated by the appended claims.

The invention claimed is:

1. A semiconductor device, comprising:
a substrate, a plurality of conductive contact plugs which are arranged at intervals being formed on the substrate, wherein the conductive contact plugs comprise a plurality of first conductive contact plugs and a second conductive contact plug;
a capacitor array, comprising a plurality of columnar capacitors which are arranged at intervals, each of the columnar capacitors being formed on a respective one of the first conductive contact plugs, and a lower electrode layer of the columnar capacitor being in contact connection with the respective one of the first conductive contact plugs; and
a supporting structure, the supporting structure being formed on the substrate at an edge of the capacitor array and surrounding the capacitor array, a bottom of the supporting structure being in contact with the second conductive contact plug, a spacing between an inner wall and an outer wall of the supporting structure on any cross section parallel to the substrate being greater than an aperture of a capacitor hole of any one of the columnar capacitors on the cross section, the inner wall and the outer wall of the supporting structure being of conductive materials and a dielectric material filling up the spacing between the inner wall and the outer wall of the supporting structure.

2. The semiconductor device of claim 1, wherein the respective one of the first conductive contact plugs is in contact with the lower electrode layer of the columnar capacitor.

3. The semiconductor device of claim 1, wherein an insulating dielectric layer is at least formed on the substrate, the capacitor array and the supporting structure being formed in the insulating dielectric layer.

4. The semiconductor device of claim 2, wherein an orthographic projection of the supporting structure on the second conductive contact plug coincides with a boundary of the second conductive contact plug.

5. The semiconductor device of claim 3, wherein the substrate comprises a unit region and a peripheral region, the capacitor array being formed in the unit region, the conductive contact plugs further comprising a peripheral conductive contact plug, the peripheral conductive contact plug being formed in the peripheral region, the semiconductor device further comprising an interconnection structure connected with the peripheral conductive contact plug, and the interconnection structure being formed in the insulating dielectric layer.

6. The semiconductor device of claim 3, wherein the insulating dielectric layer comprises a first insulating dielectric layer and a second insulating dielectric layer which are arranged at intervals along a direction perpendicular to the substrate, the capacitor array and the supporting structure being formed in the first insulating dielectric layer and the second insulating dielectric layer.

7. The semiconductor device of claim 2, wherein the second conductive contact plug has an annular shape, and the first conductive contact plugs are provided and located within the annular shape of the second conductive contact plug.

8. The semiconductor device of claim 7, wherein the capacitor array further comprises an insulating layer, wherein the insulating layer is distributed among the first conductive contact plugs to separate the first conductive contact plugs.

9. The semiconductor device of claim 1, further comprising a semiconductor layer, wherein the semiconductor layer covers a surface of the capacitor array and fills up capacitor holes of the columnar capacitors and gaps between two adjacent columnar capacitors in the capacitor array.

10. The semiconductor device of claim 3, wherein the supporting structure is a non-continuous segment and comprises a plurality of supporting regions which are distributed at intervals, each of supporting columns is formed on a respective one of the supporting regions, and each supporting column is in contact connection with the insulating dielectric layer of the capacitor array, so as to provide segmented support for the capacitor array.

11. A forming method of a semiconductor device, wherein the forming method comprises:
providing a substrate;
forming a plurality of conductive contact plugs which are arranged at intervals on the substrate, wherein the conductive contact plugs comprise a plurality of first conductive contact plugs and a second conductive contact plug;
forming a capacitor array, the capacitor array comprising a plurality of columnar capacitors which are arranged at intervals, each of the columnar capacitors being formed on a respective one of the first conductive contact plugs, and a lower electrode layer of the columnar capacitor being in contact connection with the respective one of the first conductive contact plugs; and
forming a supporting structure, the supporting structure being formed on the substrate at an edge of the capacitor array and surrounding the capacitor array, a bottom of the supporting structure being in contact with the second conductive contact plug, a spacing between an inner wall and an outer wall of the supporting structure on any cross section parallel to the substrate being greater than an aperture of a capacitor hole of any one of the columnar capacitors on the cross section, the inner wall and the outer wall of the supporting structure being of conductive materials and a dielectric material filling up the spacing between the inner wall and the outer wall of the supporting structure.

12. The forming method of claim 11, wherein the substrate has a unit region, the conductive contact plugs which are arranged at intervals being formed on the unit region, and a width of the second conductive contact plug at an edge of the unit region being greater than a width of the first conductive contact plugs at a non-edge of the unit region, wherein forming the capacitor array and the supporting structure comprises:
sequentially forming a sacrificial layer and an insulating dielectric layer on the substrate, etching the sacrificial layer and the insulating dielectric layer in the unit region by taking the conductive contact plugs as an etching stop layer, forming a plurality of columnar void structures which are arranged at intervals in the unit region, and controlling an etching window, so that a cross-sectional spacing of the columnar void structures at a periphery of the unit region along a direction parallel to the substrate is greater than a cross-sectional spacing of the columnar void structures at a non-periphery of the unit region;
depositing a lower electrode material serving as the conductive materials, and forming a lower electrode layer on sidewalls of the columnar void structures;
depositing the dielectric material, the dielectric material filling up the columnar void structures at the periphery of the unit region to form the supporting structure, and the columnar void structures at the non-periphery of the unit region being not filled;
removing the sacrificial layer in the unit region, and retaining the insulating dielectric layer; and
sequentially forming a capacitor dielectric layer and an upper electrode layer on the lower electrode layer of the columnar void structures at the non-periphery of the unit region, to form the capacitor array.

13. The forming method of claim 12, wherein the substrate further has a peripheral region, and the method further comprises: before etching the sacrificial layer and the insulating dielectric layer in the unit region,
forming an interconnection structure in the peripheral region.

14. The forming method of claim 13, wherein forming the interconnection structure comprises:
forming a peripheral conductive contact plug in the peripheral region while forming the conductive contact plugs on the unit region of the substrate;
forming a first sacrificial layer in the peripheral region;
etching the first sacrificial layer by taking the peripheral conductive contact plug in the peripheral region as the etching stop layer, to form a first via hole; and
forming a first interconnection structure in the first via hole.

15. The forming method of claim 14, further comprising: after forming the interconnection structure,
sequentially forming the insulating dielectric layer and a second sacrificial layer on the first sacrificial layer in the peripheral region, and etching the insulating dielectric layer and the second sacrificial layer by taking the first interconnection structure as the etching stop layer to form a second via hole; and
forming a second interconnection structure in the second via hole.

\* \* \* \* \*